United States Patent
Tseng et al.

(10) Patent No.: US 8,791,725 B2
(45) Date of Patent: Jul. 29, 2014

(54) HIGH VOLTAGE OFFSET DETECTION CIRCUIT

(71) Applicant: Richtek Technology Corp., Chupei (TW)

(72) Inventors: Pei-Kai Tseng, Keelung (TW); Chien-Fu Tang, Hsinchu (TW); Issac Y. Chen, Jubei (TW); Jyun-Che Ho, Xikou Township, Chiayi County (TW)

(73) Assignee: Richtek Technology Corp., Chupei, Hsinchu (TW)

( * ) Notice: Subject to any disclaimer, the term of this patent is extended or adjusted under 35 U.S.C. 154(b) by 0 days.

(21) Appl. No.: 14/062,192

(22) Filed: Oct. 24, 2013

(65) Prior Publication Data

US 2014/0118029 A1 May 1, 2014

Related U.S. Application Data

(62) Division of application No. 13/665,631, filed on Oct. 31, 2012, now Pat. No. 8,723,560.

(30) Foreign Application Priority Data

Oct. 31, 2011 (TW) .............................. 100139645 A (51) Int. Cl.
H03K 3/00 (2006.01)
H03K 5/1536 (2006.01)

(52) U.S. Cl.
CPC .................................... *H03K 5/1536* (2013.01)
USPC .............................................. 327/108; 326/88

(58) Field of Classification Search
USPC ......................... 327/108–112; 326/82, 83, 88
See application file for complete search history.

(56) References Cited

U.S. PATENT DOCUMENTS

| 6,737,842 | B2 * | 5/2004 | Bai et al. ........................ 323/282 |
| 7,049,767 | B2 | 5/2006 | Wilhelm |
| 7,323,825 | B2 * | 1/2008 | Hwang et al. ................. 315/224 |
| 7,436,160 | B2 * | 10/2008 | Rusu et al. .................... 323/284 |

* cited by examiner

*Primary Examiner* — William Hernandez
(74) *Attorney, Agent, or Firm* — Muncy, Geissler, Olds & Lowe, P.C.

(57) ABSTRACT

A high voltage half-bridge driver circuit has a high voltage terminal and a floating node to be connected with a high side switch therebetween. When turning on the high side switch, a high voltage offset detection circuit detects a voltage related to the voltage at the floating node for triggering a zero voltage switching signal.

8 Claims, 12 Drawing Sheets

HIGH VOLTAGE OFFSET DETECTION CIRCUIT

CROSS REFERENCE TO RELATED APPLICATIONS

This application is a Divisional of co-pending application Ser. No. 13/665,631, filed on Oct. 31, 2012, for which priority is claimed under 35 U.S.C. §120; and this application claims priority of Application No. 100139645 filed in Taiwan, R.O.C. on Oct. 31, 2011 under 35 U.S.C. §119; the entire contents of all of which are hereby incorporated by reference.

FIELD OF THE INVENTION

The present invention is related generally to a high voltage half-bridge driver circuit and, more particularly, to a high voltage offset detection circuit for a high voltage half-bridge driver circuit.

BACKGROUND OF THE INVENTION

Figure 1:
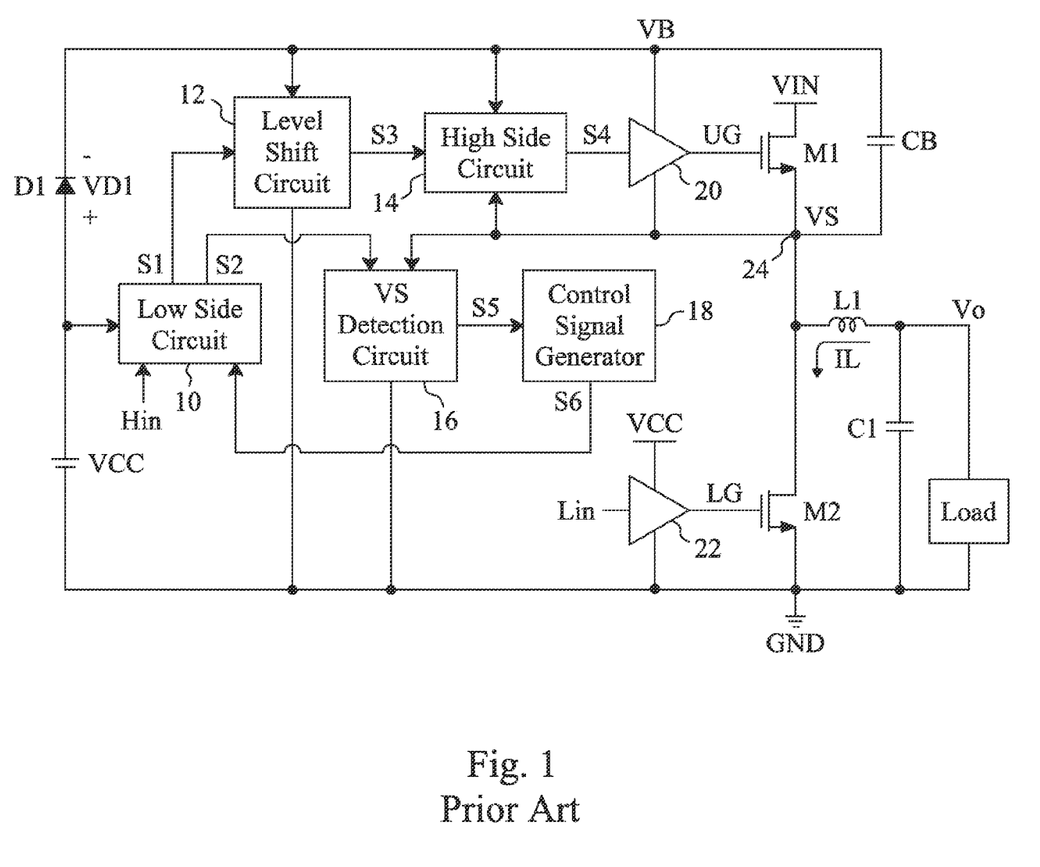
FIG. 1 is a circuit diagram of a half-bridge driver circuit.

High voltage half-bridge and full-bridge driver circuits are used in various applications such as motors, electronic ballasts, dual-inductor single-capacitor converters, and cold cathode fluorescent lamps (CCFL), and required to convert certain logic signals from low voltage to high voltage in order to control the high-voltage components. For example, in a half-bridge driver circuit as shown in FIG. 1, control signals Hin and Lin are used to switch a high side switch M1 and a low side switch M2 connected in series between a high voltage terminal VIN and a low voltage terminal GND, respectively. The direct-current (DC) supply voltage VIN is very high, maybe up to 600V or above, while the control signal Hin and Lin are generated by a logic circuit with reference to a low voltage power source VCC (e.g. 5V or 12V), and thus the control signal Hin for the high side switch M1 must be shifted from a low voltage level to a high voltage level. More particularly, in virtue to the operation of a low side circuit 10, a level shift circuit 12, and a high side circuit 14, a control signal S4 is derived from the control signal Hin for a high voltage driver 20 to generate a control signal UG for controlling the high side switch M1. On the other hand, the control signal Lin is directly provided to a low voltage driver 22 to generate a control signal LG for controlling the low side switch M2. During the high side switch M1 is on and the low side switch M2 is off, the voltage VS at the floating node 24 between the high side switch M1 and the low side switch M2 is equal to the DC supply voltage VIN. On the contrary, during the high side switch M1 is off and the low side switch M2 is on, the voltage VS at the floating node 24 is equal to the ground voltage GND. Assuming that VS=600V and GND=0V, when the switches M1 and M2 are switched, the across voltage thereof can be as high as 600V. Since the on resistance of either of the switches M1 and M2 is typically of mΩ order, a high current of kA order may be generated when the switches M1 and M2 are switched and likely damages the switch M1 or M2. Such conditions that the switches M1 and M2 suffer high across voltage are referred to "hard switching".

To avoid hard switching, a VS offset detection circuit 16 is used to detect the voltage VS at the floating node 24, to generate a zero voltage switching (ZVS) signal S5 for the control signal generator 18 to determine whether a hard switching occurs. If so, a signal S6 is triggered for the low side circuit 10 to adjust the dead time of the switches M1 and M2. In addition, the signal S6 may be used to adjust the resonant frequency of the inductor L1 and the capacitor C1, or to turn off the driver circuit. However, in prior arts, for example U.S. Pat. No. 7,049,767, the VS offset detection circuit can detect the voltage VS only when the high side switch is off.

SUMMARY OF THE INVENTION

An objective of the present invention is to provide a high voltage offset detection circuit for detecting the voltage at a floating node of a high voltage half-bridge driver circuit.

Another objective of the present invention is to provide a high voltage offset detection circuit for detecting the voltage at a floating node of a high voltage half-bridge driver circuit when a high side switch is on.

According to the present invention, a high voltage offset detection circuit for a high voltage half-bridge driver circuit includes a high voltage device and a ZVS generator. The high voltage half-bridge driver circuit includes a floating node, a high voltage terminal for a high side switch to be connected between the high voltage terminal and the floating node, a low voltage terminal for a low side switch to be connected between the low voltage terminal and the floating node, a bootstrap capacitor connected between a high side power source and the floating node, a high voltage driver to provide a first control signal to control the high side switch, and a low voltage driver providing a second control signal to control the low side switch. The high voltage device has an input terminal, an output terminal, a control terminal, and a parasitic capacitance existing between the input terminal and the output terminal of the high voltage device. The input terminal of the high voltage device receives a voltage related to the voltage at the floating node, and the control terminal of the high voltage device receives a voltage to remain the high voltage device off. The ZVS generator detects the voltage at the output terminal of the high voltage device when turning on the high side switch or turning off the low side switch, for triggering a ZVS signal.

According to the present invention, a high voltage offset detection circuit for a high voltage half-bridge driver circuit includes a capacitor and a ZVS generator. The high voltage half-bridge driver circuit includes a floating node, a high voltage terminal for a high side switch to be connected between the high voltage terminal and the floating node, a low voltage terminal for a low side switch to be connected between the low voltage terminal and the floating node, a bootstrap capacitor connected between a high side power source and the floating node, a high voltage driver to provide a first control signal to control the high side switch, and a low voltage driver providing a second control signal to control the low side switch. The capacitor has a first terminal to receive a voltage related to the voltage at the floating node, and the ZVS generator detects the voltage at a second terminal of the capacitor when turning on the high side switch or turning off the low side switch, for triggering a ZVS signal.

According to the present invention, a high voltage offset detection circuit for a high voltage half-bridge driver circuit includes a high voltage device and a ZVS generator. The high voltage half-bridge driver circuit includes a floating node, a high voltage terminal for a high side switch to be connected between the high voltage terminal and the floating node, a low voltage terminal for a low side switch to be connected between the low voltage terminal and the floating node, a bootstrap capacitor connected between a high side power source and the floating node, a high voltage driver to provide a first control signal to control the high side switch, and a low voltage driver providing a second control signal to control the low side switch. The high voltage device has an input terminal, an output terminal, and a control terminal. The input terminal of the high voltage device receives a voltage related to the voltage at the floating node, and the control terminal of the high voltage device receives a voltage to remain the high voltage device on. The ZVS generator detects the voltage at the output terminal of the high voltage device when turning on the high side switch or turning off the low side switch, for triggering a ZVS signal.

According to the present invention, a high voltage offset detection circuit for a high voltage half-bridge driver circuit includes a high voltage device, a controller, and a ZVS generator. The high voltage half-bridge driver circuit includes a floating node, a high voltage terminal for a high side switch to be connected between the high voltage terminal and the floating node, a low voltage terminal for a low side switch to be connected between the low voltage terminal and the floating node, a bootstrap capacitor connected between a high side power source and the floating node, a high voltage driver to provide a first control signal to control the high side switch, and a low voltage driver providing a second control signal to control the low side switch. The high voltage device has an input terminal, an output terminal, and a control terminal. The input terminal of the high voltage device receives a voltage related to the voltage at the floating node, and the ZVS generator detects the voltage at the output terminal of the high voltage device when turning on the high side switch or turning off the low side switch, for triggering a ZVS signal. The controller is connected to the control terminal of the high voltage device for selectively turning off the high voltage device when the ZVS generator detects the voltage at the output terminal of the high voltage device.

According to the present invention, a high voltage offset detection circuit for a high voltage half-bridge driver circuit includes a high voltage device and a ZVS generator. The high voltage half-bridge driver circuit includes a floating node, a high voltage terminal for a high side switch to be connected between the high voltage terminal and the floating node, a low voltage terminal for a low side switch to be connected between the low voltage terminal and the floating node, a bootstrap capacitor connected between a high side power source and the floating node, a high voltage driver to provide a first control signal to control the high side switch, a low voltage driver providing a second control signal to control the low side switch, and a level shift circuit to shift the level of a low voltage logic signal to generate the first control signal. The high voltage device has an input terminal, an output terminal, and a control terminal, and the input terminal and the control terminal are connected to the level shift circuit. The input terminal of the high voltage device receives a voltage related to the voltage at the floating node, and the ZVS generator detects the voltage at the output terminal of the high voltage device when turning on the high side switch or turning off the low side switch, for triggering a ZVS signal.

BRIEF DESCRIPTION OF THE DRAWINGS

These and other objectives, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 2:
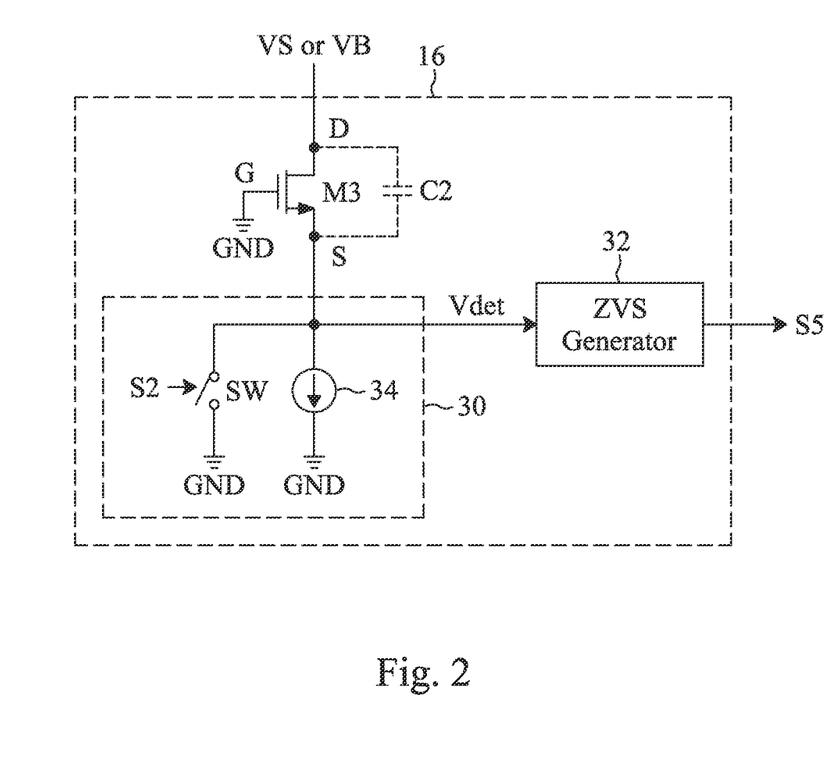
FIG. 2 is a circuit diagram of a first embodiment according to the present invention.

FIG. 2 is a circuit diagram of a first embodiment according to the present invention, in which a high voltage offset detection circuit 16 includes an NMOS transistor M3, a programmable load element 30, and a ZVS generator 32. The NMOS transistor M3 is a high voltage device, and has a control terminal G grounded, and thus the NMOS transistor M3 remains off. The NMOS transistor M3 has an input terminal D connected to the floating node 24 as shown in FIG. 1, for detecting the voltage VS at the floating node 24. When the voltage VS at the input terminal D varies, a parasitic capacitance C2 existing between the input terminal D and an output terminal S of the NMOS transistor M3 leads the voltage Vdet at the output terminal S to vary accordingly. Therefore, the voltage Vdet may be used to identify the state of the voltage VS at the floating node 24. The NMOS transistor M3 can detect the voltage VS no matter the high side switch M1 is on or off. As shown in FIG. 1, a bootstrap capacitor CB is connected between the high side power source VB and the floating node 24, and thus, when the voltage VS at the floating node 24 changes instantly, the voltage VB changes accordingly. Thus, the NMOS transistor M3 may monitor the voltage VS by detecting the high side power source VB. In this half-bridge driver circuit, the high side power source VB that the bootstrap capacitor CB is connected provides a high side voltage. When VS=0, a power source VCC charges the bootstrap capacitor CB through a diode D1, such that the voltage across the capacitor CB reaches VCC-VD1. In other embodiments, in addition to the voltages VS and VB, a voltage at any other terminal may be detected for generating the voltage Vdet, provided that the voltage at that terminal is related to the voltage VS. The ZVS generator 32 detects the voltage Vdet to generate a ZVS signal S5, and the half-bridge driver circuit identifies whether a hard switching occurs according to the ZVS signal S5. A programmable load element 30 is connected to the output terminal S of the NMOS transistor M3, and includes a current source 34 connected between the output terminal S of the NMOS transistor M3 and a ground terminal GND, and a switch SW connected in parallel to the current source 34. The load value of the programmable load element 30 can be changed by controlling the switch SW. When the switch SW is turned on by a signal S2, charges of the output terminal S will be released to the ground terminal GND.

Figure 3:
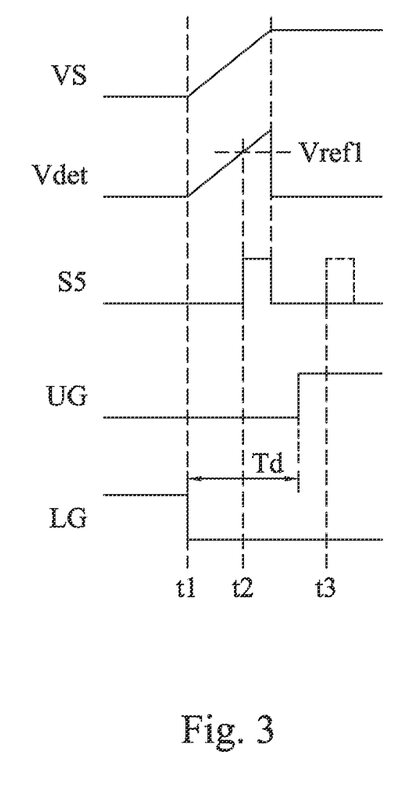
FIG. 3 is a timing diagram of the half-bridge driver circuit shown in FIG. 1 using the high voltage offset detection circuit shown in FIG. 2.

Referring to FIG. 1 and FIG. 2, during the high side switch M1 is off and the low side switch M2 is on, the inductor current IL flows to a ground terminal GND through the floating node 24 and the low side switch M2, and then, when the low side switch M2 is turned off, as shown at time t1 in FIG. 3, the inductor current IL still flows to the floating node 24, thereby boosting the voltage VS. At the same time, the parasitic capacitance C2 couples the variation of the voltage VS to the output terminal S of the NMOS transistor M3, causing the voltage Vdet to increase. When the voltage Vdet reaches a predetermined threshold Vref1, the ZVS generator 32 triggers the ZVS signal S5. As shown at time t2 in FIG. 3, if the ZVS signal S5 is triggered before the high side switch M1 is turned on, there is no hard switching. On the contrary, if the ZVS signal S5 is triggered after the high side switch M1 is turned on, as shown at time t3 in FIG. 3, the half-bridge driver circuit has a hard switching. Likewise, when the high side switch M1 changes from on to off, the voltages VS and Vdet start to decrease. When the voltage Vdet becomes lower than another predetermined threshold Vref2, the ZVS signal S5 is triggered. If the ZVS signal S5 is triggered before the low side switch M2 is turned on, there is no hard switching. On the contrary, if the ZVS signal S5 is triggered after the low side switch M2 is turned on, the half-bridge driver circuit has a hard switching.

Figure 4:
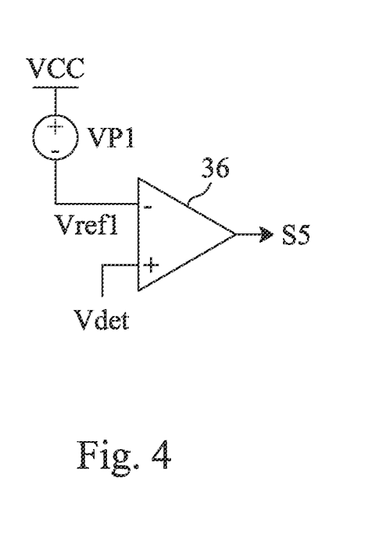
FIG. 4 is a circuit diagram of a first embodiment for the ZVS generator shown in FIG. 2.
Figure 5:
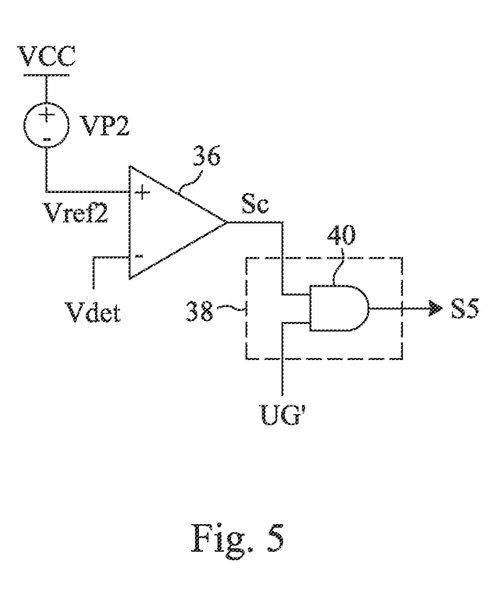
FIG. 5 is a circuit diagram of a second embodiment for the ZVS generator shown in FIG. 2.
Figure 6:
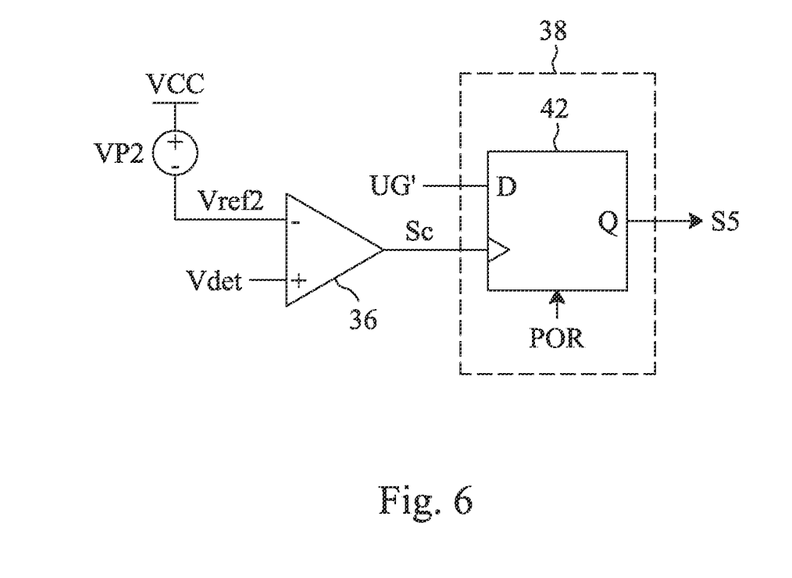
FIG. 6 is a circuit diagram of a third embodiment for the ZVS generator shown in FIG. 2.

FIG. 4 is a circuit diagram of a first embodiment for the ZVS generator 32 shown in FIG. 2, which includes a comparator 36 for comparing the voltage Vdet with the threshold Vref1, where the threshold Vref1 is equal to the result of subtracting a preset voltage VP1 from the power source voltage VCC provided to the low voltage driver 22, i.e. Vref1=VCC-VP1. Thus, in this embodiment, the threshold Vref1 is related to the power source voltage VCC. When the voltage Vdet rises beyond the threshold Vref1, the comparator 36 triggers the ZVS signal S5. FIG. 5 is a circuit diagram of a second embodiment for the ZVS generator 32 shown in FIG. 2, which includes a comparator 36 and a logic circuit 38. The comparator 36 compares the voltage Vdet with the threshold Vref2, where the threshold Vref2 is equal to the result of subtracting a preset voltage VP2 from the power source voltage VCC, i.e. Vref2=VCC-VP2, and thus the threshold Vref2 is related to the power source voltage VCC. When the voltage Vdet decreases beyond the threshold Vref2, the comparator 36 triggers the comparison signal Sc. The logic circuit 38 includes an AND gate 40 that generates the ZVS signal S5 according to the comparison signal Sc and an inverted signal UG' of the control signal UG. In other embodiments, it is feasible to use the control signal LG to replace the inverted signal UG'. FIG. 6 is a circuit diagram of a third embodiment for the ZVS generator 32 shown in FIG. 2. Similar to the circuit shown in FIG. 5, it also includes a comparator 36 and a logic circuit 38; however, the logic circuit 38 includes a D-type flip-flop that generates the ZVS signal S5 according to the comparison signal Sc and the inverted signal UG'.

Figure 7:
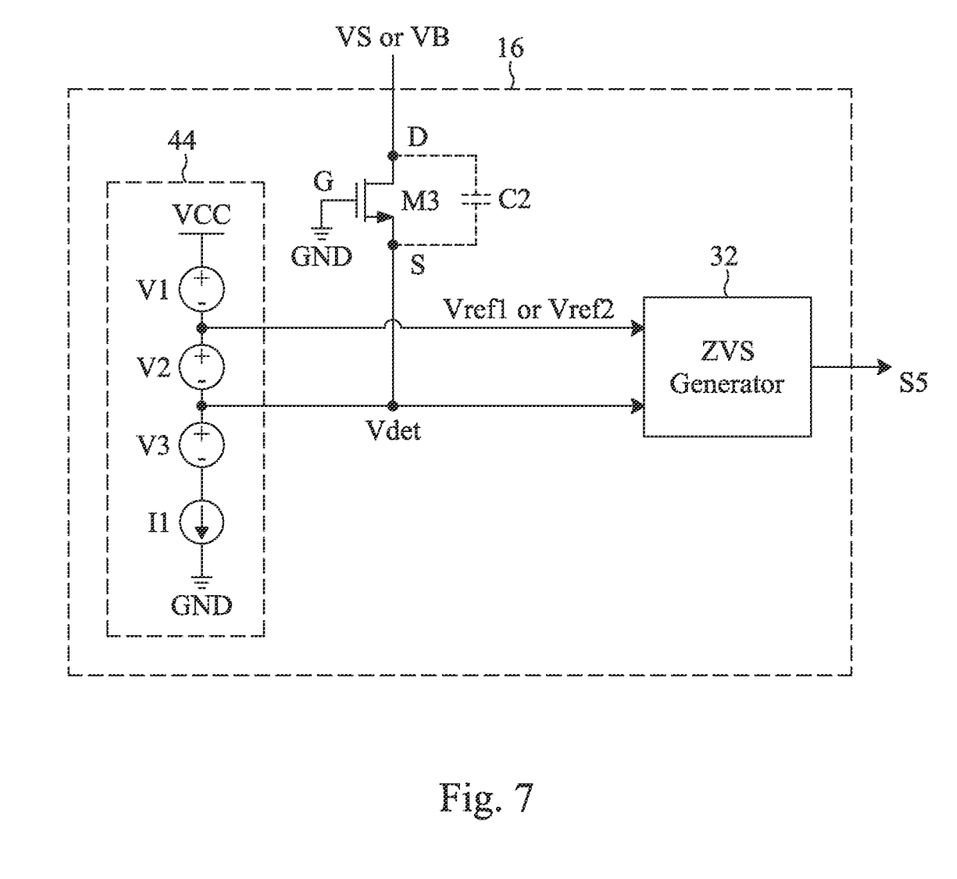
FIG. 7 is a circuit diagram of a second embodiment according to the present invention.

The embodiment shown in FIG. 7 is designed by replacing the programmable load element 30 shown in FIG. 2 with a bias circuit 44. The bias circuit 44 includes voltage sources V1, V2, and V3 and a current source I1 that are connected in series between the power source input terminal VCC and a ground terminal GND. The bias circuit 44 not only provides a bias voltage applied to the output terminal S of the NMOS transistor M3, but also provides the threshold Vref1 or Vref2 related to the power source voltage VCC for the ZVS generator 32.

Figure 8:
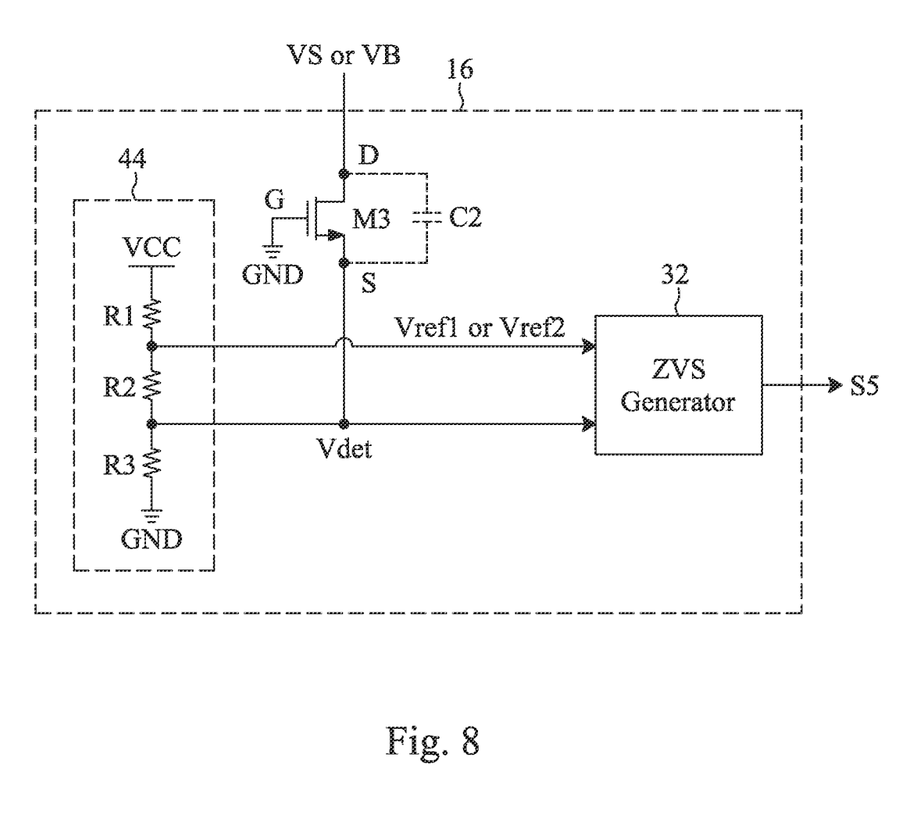
FIG. 8 is a circuit diagram of a third embodiment according to the present invention.

By replacing the bias circuit 44 shown in FIG. 7 with a plurality of resistors R1, R2, and R3 connected in series, another embodiment is shown in FIG. 8. The resistors R1, R2, and R3 divide the power source voltage VCC to generate the bias voltage for the output terminal S of the NMOS transistor M3 and the threshold Vref1 or Vref2 related to the power source voltage VCC for the ZVS generator 32.

Figure 9:
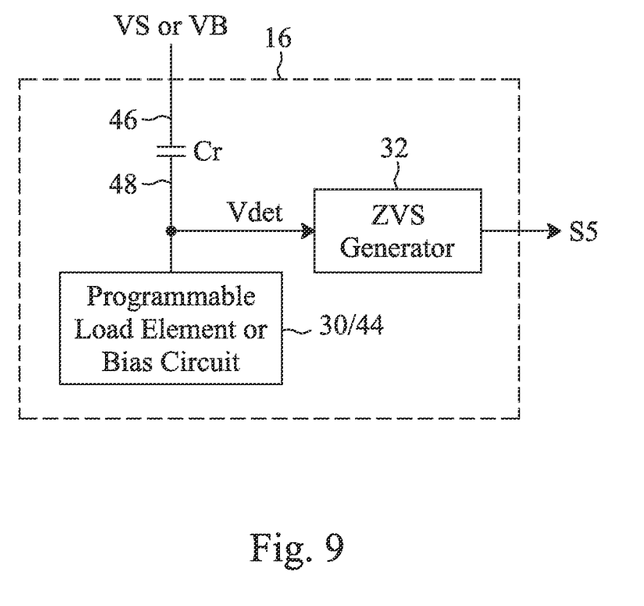
FIG. 9 is a circuit diagram of a fourth embodiment according to the present invention.

FIG. 9 is a circuit diagram of a fourth embodiment according to the present invention, in which a high voltage offset detection circuit 16 includes a capacitor Cr having a first terminal 46 for detecting the voltage VS or VB, a programmable load element 30 or a bias circuit 44 connected to a second terminal 48 of the capacitor Cr, and a ZVS generator 32 for detecting the voltage Vdet at the second terminal of the capacitor Cr to trigger a ZVS signal S5. When the voltage VS or VB changes instantly, the voltage Vdet at the second terminal of the capacitor Cr changes accordingly. Thus, the voltage VS at the floating node 24 can be identified from the voltage Vdet.

Figure 10:
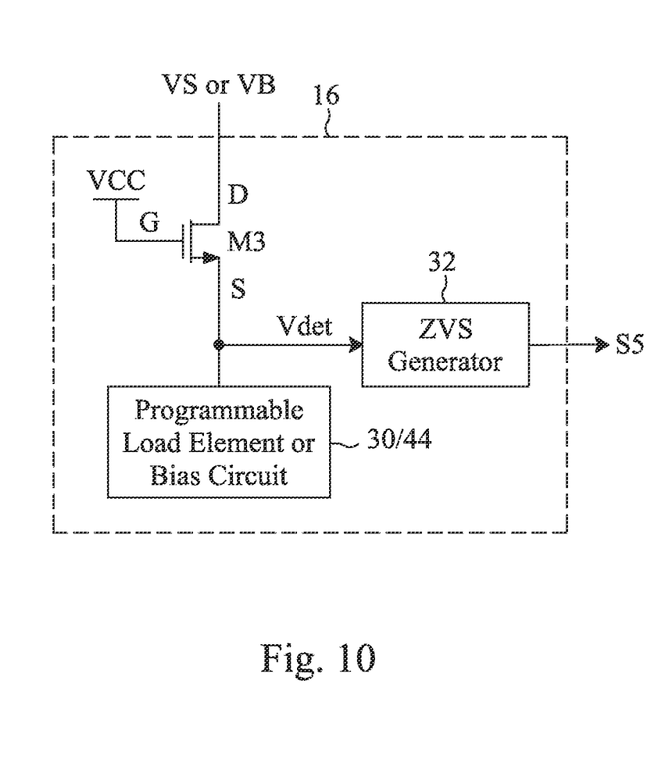
FIG. 10 is a circuit diagram of a fifth embodiment according to the present invention.
Figure 11A:
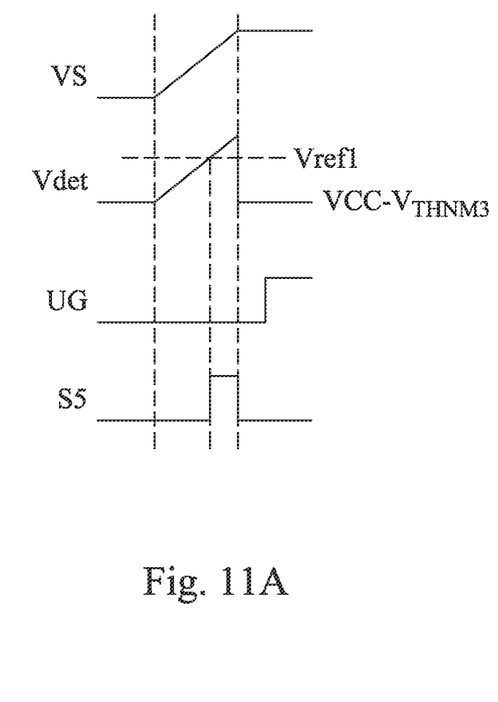
FIGS. 11A and 11B are waveform diagrams of the circuit shown in FIG. 10.
Figure 11B:
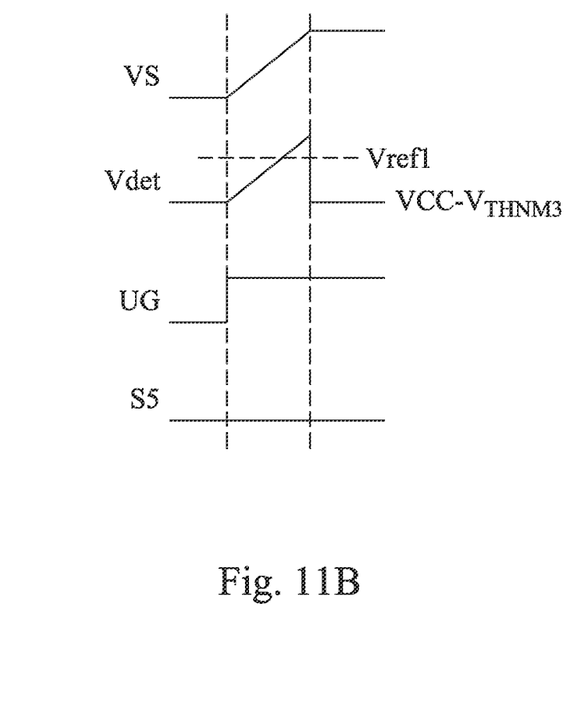

By replacing the capacitor Cr shown in FIG. 9 with an NMOS transistor M3, an embodiment is shown in FIG. 10. The NMOS transistor M3 has an input terminal D to receive the voltage VS or VB, the programmable load element 30 or the bias circuit 44 is connected to an output terminal S of the NMOS transistor M3, and the ZVS generator 32 detects the voltage Vdet at the output terminal S of the NMOS transistor for triggering a ZVS signal S5. FIG. 11 is a waveform diagram of the circuit shown in FIG. 10. The NMOS transistor M3 has a gate G to receive the power source voltage VCC, to thereby remain the NMOS transistor M3 on. Thus, when the high side switch M1 shown in FIG. 1 is off and the low side switch M2 is on, the voltage Vdet at the output terminal S of the NMOS transistor M3 is VCC-$V_{THNM3}$, where $V_{THNM3}$ is the threshold voltage of the NMOS transistor M3. During the low side switch M2 is off and the high side switch M1 has not been turned on yet, the voltage VS or VB rises, thereby pushing the voltage Vdet to rise. If the high side switch M1 has not been turned on yet when the voltage Vdet reaches the threshold Vref1, there is no hard switching, as shown in FIG. 11A. On the other hand, if the voltage Vdet reaches the threshold Vref1 after the high side switch M1 is turned on, a hard switching occurs, as shown in FIG. 11B.

Figure 12:
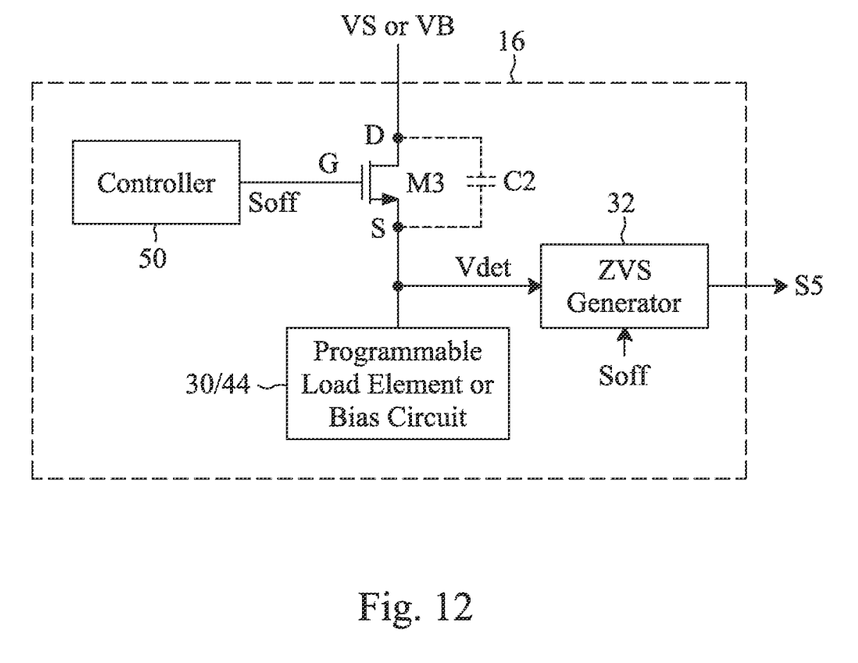
FIG. 12 is a circuit diagram of a sixth embodiment according to the present invention.

FIG. 12 is a circuit diagram of a sixth embodiment according to the present invention. In this high voltage offset detection circuit 16, an NMOS transistor M3 has an input terminal D to receive the voltage VS or VB, a programmable load element 30 or a bias circuit 44 is connected to an output terminal S of the NMOS transistor M3, a ZVS generator 32 detects the voltage Vdet at the output terminal S of the NMOS transistor NMOS when the transistor M3 is off, for triggering a ZVS signal S5, a controller 50 provides a control signal Soff to a control terminal G of the NMOS transistor M3 to selectively turn off the NMOS transistor M3. As described previously, when the NMOS transistor M3 is off, the parasitic capacitance C2 makes the voltage Vdet vary with the voltage VS or VB at the input terminal D. Thus, the voltage Vdet is useful to identify the voltage VS at the floating node 24.

Figure 13:
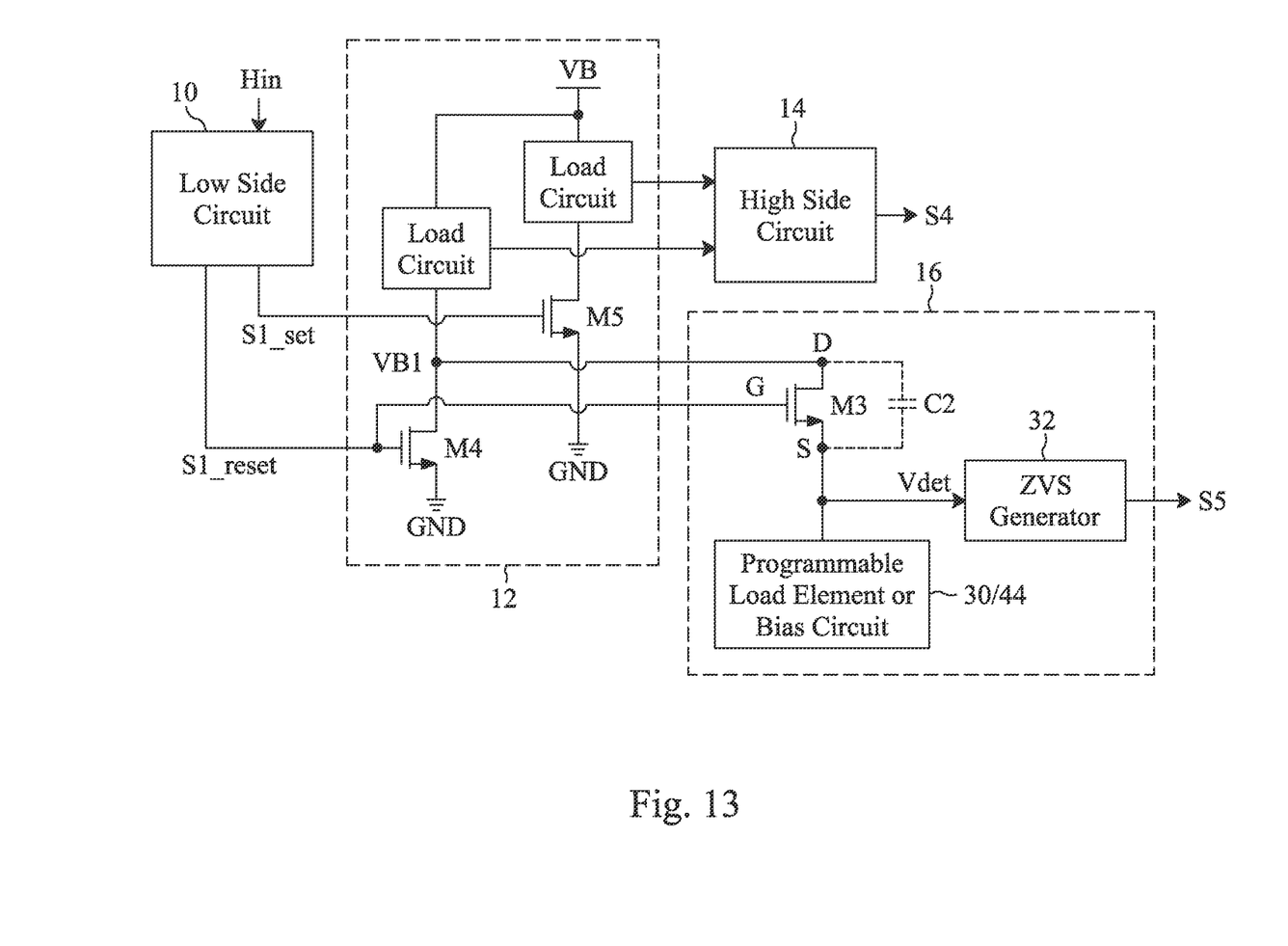
FIG. 13 is a circuit diagram of a seventh embodiment according to the present invention.

FIG. 13 is a circuit diagram of a seventh embodiment according to the present invention. In the high voltage offset detection circuit 16, an input terminal D of an NMOS transistor M3 is connected to a drain VB1 of an NMOS transistor M4 in a level shift circuit 12, a control terminal G of the NMOS transistor M3 is connected to a gate of the NMOS transistor M4, a programmable load element 30 or a bias circuit 44 is connected to an output terminal S of the NMOS transistor M3, a ZVS generator 32 detects a voltage Vdet at the output terminal S of the NMOS transistor M3 when the NMOS transistor M3 is off, for triggering a ZVS signal S5. During the NMOS transistors M3 and M4 are turned off by the signal S1 reset of the low side circuit 10, the drain voltage VB1 of the NMOS transistor M4 is related to the voltage VB, so any instant change of the voltage VS can make the voltage VB1 vary accordingly. The parasitic capacitance C2 of the NMOS transistor M3 makes the voltage Vdet at the output terminal S of the NMOS transistor M3 vary with the voltage VB1 at the input terminal D of the NMOS transistor M3, so the voltage VS at the floating node 24 can be derived from the voltage Vdet. The NMOS transistor M3 may be realized with a part of the structure of the NMOS transistor M4, to minimize the integrated circuit in area. The operations and principles of the level shift circuit 12 are known in the art and need no to be described at length herein. In other embodiments, the input terminal D and the control terminal G of the NMOS transistor M3 may be alternatively connected to the drain and gate of an NMOS transistor M5 in the level shift circuit 12, and in this case, the NMOS transistor M3 may be realized with a part of the structure of the NMOS transistor M5.

While the above embodiments illustrate the present invention in a half-bridge driver circuit, it is appreciated that the present invention is also applicable to a full-bridge driver circuit.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A high voltage offset detection circuit for detecting a voltage at a floating node of a high voltage half-bridge driver circuit which includes a high voltage terminal for a high side switch to be connected between the high voltage terminal and the floating node, a low voltage terminal for a low side switch to be connected between the low voltage terminal and the floating node, a bootstrap capacitor connected between a high side power source and the floating node, a high voltage driver to provide a first control signal to control the high side switch, and a low voltage driver to provide a second control signal to control the low side switch, the high voltage offset detection circuit comprising:

a high voltage device having an input terminal to receive a first voltage related to the voltage at the floating node, an output terminal having a second voltage, a control terminal, and a parasitic capacitance existing between the input terminal and the output terminal of the high voltage device;

a zero voltage switching generator connected to the output terminal of the high voltage device, operative to detect the second voltage when turning on the high side switch or turning off the low side switch, for triggering a zero voltage switching signal according to the detected second voltage and a threshold related to a power source voltage of the low voltage driver; and a controller connected to the control terminal of the high voltage device, operative to provide a third control signal for selectively turning off the high voltage device when the zero voltage switching generator detects the second voltage;

wherein the input terminal of the high voltage device is connected to the floating node, the high side power source, or a terminal having a voltage related to the voltage at the floating node.

2. The high voltage offset detection circuit of claim 1, wherein the zero voltage switching generator comprises a comparator connected to the output terminal of the high voltage device, operative to compare the detected second voltage with the threshold for triggering the zero voltage switching signal.

3. The high voltage offset detection circuit of claim 1, wherein the zero voltage switching generator comprises:

a comparator connected to the output terminal of the high voltage device, operative to compare the detected second voltage with the threshold for generating a comparison signal; and a logic circuit connected to the comparator, operative to determine the zero voltage switching signal according to the comparison signal and either of the first control signal and the second control signal.

4. The high voltage offset detection circuit of claim 1, further comprising a programmable load element connected to the output terminal of the high voltage device.

5. The high voltage offset detection circuit of claim 4, wherein the programmable load element comprises:

a current source connected to the output terminal of the high voltage device; and a switch connected in parallel to the current source.

6. The high voltage offset detection circuit of claim 1, further comprising a bias circuit connected to the output terminal of the high voltage device, operative to provide a bias voltage applied to the output terminal of the high voltage device.

7. The high voltage offset detection circuit of claim 6, wherein the bias circuit comprises a plurality of voltage sources connected in series for determining the bias voltage.

8. The high voltage offset detection circuit of claim 6, wherein the bias circuit comprises a plurality of resistors connected in series to divide the power source voltage of the low voltage driver for determining the bias voltage.

\* \* \* \* \*